United States Patent
Fukumoto et al.

(10) Patent No.: US 11,387,421 B2
(45) Date of Patent: Jul. 12, 2022

(54) SOLAR CELL AND METHOD FOR PRODUCING SAME

(71) Applicant: SEKISUI CHEMICAL CO., LTD., Osaka (JP)

(72) Inventors: Yuuichirou Fukumoto, Ibaraki (JP); Naohiro Fujinuma, Glassboro, NJ (US); Junichiro Anzai, Ibaraki (JP); Akinobu Hayakawa, Osaka (JP); Tetsuya Kurebayashi, Osaka (JP); Tetsuya Aita, Osaka (JP); Tomohito Uno, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 16/476,133

(22) PCT Filed: Mar. 29, 2018

(86) PCT No.: PCT/JP2018/013318
§ 371 (c)(1),
(2) Date: Jul. 5, 2019

(87) PCT Pub. No.: WO2018/181744
PCT Pub. Date: Oct. 4, 2018

(65) Prior Publication Data
US 2020/0013974 A1 Jan. 9, 2020

(30) Foreign Application Priority Data
Mar. 30, 2017 (JP) ............................. JP2017-068374

(51) Int. Cl.
*H01L 51/44* (2006.01)
*C07F 7/24* (2006.01)

(52) U.S. Cl.
CPC ............... *H01L 51/44* (2013.01); *C07F 7/24* (2013.01); *H01L 2251/30* (2013.01)

(58) Field of Classification Search
None
See application file for complete search history.

(56) References Cited

U.S. PATENT DOCUMENTS

2016/0254472 A1* 9/2016 Wang ................... C23C 14/5846
136/263
2016/0380125 A1* 12/2016 Snaith ................. H01L 31/1868
136/256

(Continued)

FOREIGN PATENT DOCUMENTS

JP 2004-165512 6/2004
JP 2014-056962 3/2014

(Continued)

OTHER PUBLICATIONS

Im et al. "Growth of CH3NH3PbI3 cuboids with controlled size for high-efficiency perovskite solar cells" Nature Nanotechnology, vol. 9, Nov. 2014, www.nature.com/naturenanotechnology (Year: 2014).*

(Continued)

*Primary Examiner* — Jayne L Mershon
(74) *Attorney, Agent, or Firm* — Wenderoth, Lind & Ponack, L.L.P.

(57) ABSTRACT

The present invention aims to provide a solar cell having high durability against deterioration due to moisture ingress from the side surfaces. The solar cell 10 of the present invention includes: first and second electrodes 12 and 17; a perovskite layer 14 provided between the first and second electrodes 12 and 17 and containing an organic-inorganic perovskite compound (A) represented by the formula $RMX_3$ where R is an organic molecule, M is a metal atom, and X is a halogen atom; and a side-surface-protecting layer 15 provided on a peripheral side of the perovskite layer 14 to coat at least part of a side surface of the perovskite layer 14, the side-surface-protecting layer 15 containing at least one selected from the group consisting of a metal halide (B1) and an organometal halide (B2) or containing an organohalide (C).

3 Claims, 1 Drawing Sheet

(56) References Cited

U.S. PATENT DOCUMENTS

2017/0098514 A1\* 4/2017 Geohegan ............ H01L 51/0028
2017/0309408 A1 10/2017 Hayakawa et al.
2018/0062096 A1 3/2018 Uno et al.

FOREIGN PATENT DOCUMENTS

| JP | 2016-178295 | 10/2016 |
|----|-------------|---------|
| WO | 2016/060154 | 4/2016 |
| WO | 2016/148186 | 9/2016 |

OTHER PUBLICATIONS

International Search Report dated May 22, 2018 in International (PCT) Patent Application No. PCT/JP2018/013318, with English Translation.
Hwang et al., "Enhancing Stability of Perovskite Solar Cells to Moisture by the Facile Hydrophobic Passivation", Applied Materials & Interfaces, 2015, vol. 7, No. 31, pp. 17330-17336.
Chang et al., "High-Performance, Air-Stable, Low-Temperature Processed Semitransparent Perovskite Solar Cells Enabled by Atomic Layer Deposition", Chemistry of Materials, 2015, vol. 27, No. 14, pp. 5122-5130.
Communication pursuant to Article 94(3) EPC dated Sep. 14, 2021 in corresponding European Patent Application No. 18774203.6.
Extended European Search Report dated Nov. 20, 2020 in counterpart European Patent Application No. 18774203.6.

\* cited by examiner

SOLAR CELL AND METHOD FOR PRODUCING SAME

TECHNICAL FIELD

The present invention relates to a solar cell that includes a photoelectric conversion layer containing an organic-inorganic perovskite compound, and a method for producing the solar cell.

BACKGROUND ART

Solid photoelectric conversion elements utilizing organic-inorganic perovskite compounds have been reported to exhibit high photoelectric conversion efficiency. The application of such photoelectric conversion elements to solar cells has recently been actively studied. Such a solar cell typically includes a cathode, an anode, and a photoelectric conversion layer containing an organic-inorganic perovskite compound between these electrodes. In a known solar cell, as disclosed in Patent Literature 1, an inorganic layer and a barrier layer that has a predetermined water vapor permeability are disposed in the stated order on at least one of the cathode or the anode, so as to reduce deterioration of the photoelectric conversion layer due to moisture.

CITATION LIST

Patent Literature

Patent Literature 1: JP 2016-178295 A

SUMMARY OF INVENTION

Technical Problem

The photoelectric conversion layer containing an organic-inorganic perovskite compound is very susceptible to deterioration due to moisture. The inorganic layer and the barrier layer formed on the electrode thus may not sufficiently prevent the moisture deterioration of the photoelectric conversion layer. For example, the photoelectric conversion layer containing an organic-inorganic perovskite compound may deteriorate due to moisture ingress from its side surfaces.

The present invention was made in view of the situation in the art and aims to provide a solar cell having high durability against deterioration due to moisture ingress from the side surfaces of the photoelectric conversion layer.

Solution to Problem

The inventors made intensive studies to find out that the above problems can be solved by forming a side-surface-protecting layer containing at least one selected from the group consisting of a metal halide (B1) and an organometal halide (B2) or an organohalide (C) on the peripheral side of a perovskite layer constituting the photoelectric conversion layer. The inventors thus completed the present invention. The present invention provides the following [1] to [9].

[1] A solar cell including:
first and second electrodes;
a perovskite layer provided between the first and second electrodes and containing an organic-inorganic perovskite compound (A) represented by the formula $RMX_3$ where R is an organic molecule, M is a metal atom, and X is a halogen atom; and
a side-surface-protecting layer provided on a peripheral side of the perovskite layer to coat at least part of a side surface of the perovskite layer, the side-surface-protecting layer containing at least one selected from the group consisting of a metal halide (B1) and an organometal halide (B2) or containing an organohalide (C).

[2] The solar cell according to [1],
wherein the side-surface-protecting layer is provided to surround an entire periphery of the perovskite layer.

[3] The solar cell according to [1] or [2],
wherein the organic-inorganic perovskite compound (A) is a reaction product of the at least one selected from the group consisting of the metal halide (B1) and the organometal halide (B2) with the organohalide (C).

[4] The solar cell according to [3],
wherein the organohalide (C) is an alkyl ammonium halide.

[5] The solar cell according to any one of [1] to [4],
wherein the side-surface-protecting layer has a width of 0.5 mm or more outside the periphery of the perovskite layer.

[6] A method for producing a solar cell, including the steps of:
forming a first electrode;
forming at least a perovskite layer on the first electrode by attaching at least one selected from the group consisting of a metal halide (B1) and an organometal halide (B2) and attaching an organohalide (C); and
forming a second electrode on the perovskite layer,
the at least one selected from the group consisting of the metal halide (B1) and the organometal halide (B2) being attached to a region that overlaps a region to which the organohalide (C) is attached and that protrudes outward from at least part of a periphery of the region to which the organohalide (C) is attached, or
the organohalide (C) being attached to a region that overlaps a region to which the at least one selected from the group consisting of the metal halide (B1) and the organometal halide (B2) is attached and that protrudes outward from at least part of a periphery of the region to which the at least one selected from the group consisting of the metal halide (B1) and the organometal halide (B2) is attached.

[7] The method for producing a solar cell according to [6],
wherein the region to which the at least one selected from the group consisting of the metal halide (B1) and the organometal halide (B2) is attached protrudes outward from an entire periphery of the region to which the organohalide (C) is attached.

[8] The method for producing a solar cell according to [6],
wherein the region to which the organohalide (C) is attached protrudes outward from an entire periphery of the region to which the at least one selected from the group consisting of the metal halide (B1) and the organometal halide (B2) is attached.

[9] The method for producing a solar cell according to claim [6], [7], or [8],
wherein the organohalide (C) is attached after the at least one selected from the group consisting of the metal halide (B1) and the organometal halide (B2) is attached.

Advantageous Effects of Invention

The present invention can provide a solar cell having high durability against deterioration due to moisture ingress from the side surfaces of the photoelectric conversion layer.

DESCRIPTION OF EMBODIMENTS

Figure 1:
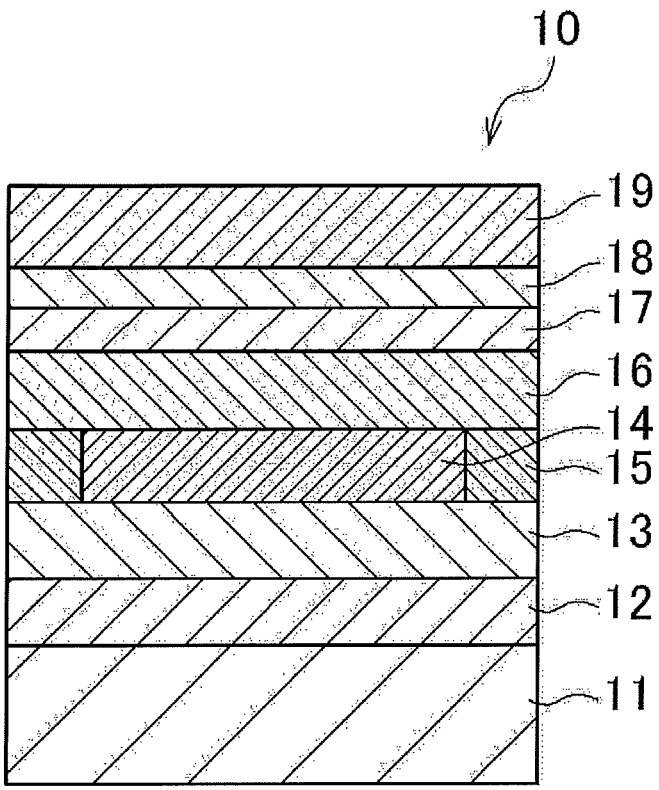
FIG. 1 is a schematic cross-sectional view of a solar cell according to one embodiment of the present invention.

The present invention is described in detail below with reference to embodiments.

The solar cell of the present invention includes: first and second electrodes, one of which serves as a cathode while the other serves as an anode; a perovskite layer provided between the first and second electrodes; and a side-surface-protecting layer provided on the peripheral side of the perovskite layer to coat a side surface of the perovskite layer.

The perovskite layer contains an organic-inorganic perovskite compound (A) and serves as a photoelectric conversion layer. The side-surface-protecting layer contains at least one selected from the group consisting of a metal halide (B1) and an organometal halide (B2) or contains an organohalide (C). In the present invention, the side-surface-protecting layer formed on the peripheral side of the perovskite layer prevents deterioration of the photoelectric conversion layer (perovskite layer) due to moisture ingress from a side surface thereof.

Hereinafter, the organic-inorganic perovskite compound (A) may also be referred to simply as a "(A) component". The same shall apply to other compounds.

Organic-Inorganic Perovskite Compound (A)

The organic-inorganic perovskite compound (A) is represented by the following formula (1):

$$RMX_3 \qquad (1)$$

where R is an organic molecule, M is a metal atom, and X is a halogen atom.

Incorporating an organic-inorganic perovskite compound (A) represented by the formula (1) into the perovskite layer as a photoelectric conversion layer allows the solar cell to have good photoelectric conversion efficiency. Solar cells that include a photoelectric conversion layer containing an organic-inorganic perovskite compound (A) are also called organic-inorganic hybrid solar cells.

In the formula (1), R is an organic molecule and is preferably represented by $C_lN_mH_n$ (l, m, and n each represent a positive integer). Specific examples of R include methylamine, ethylamine, propylamine, butylamine, pentylamine, hexylamine, dimethylamine, diethylamine, dipropylamine, dibutylamine, dipentylamine, dihexylamine, ethylmethylamine, methylpropylamine, butylmethylamine, methylpentylamine, hexylmethylamine, ethylpropylamine, ethylbutylamine, trimethylamine, triethylamine, tripropylamine, tributylamine, tripentylamine, trihexylamine, phenethylamine, aniline, pyridine, formamidine, guanidine, imidazole, azole, pyrrole, aziridine, azirine, azetidine, azete, azole, imidazoline, carbazole, and ions thereof (e.g., methyl ammonium ($CH_3NH_3$), phenethyl ammonium).

Preferred among them as the organic molecule for R are alkylamines and ions thereof. In particular, preferred are primary alkylamines such as methylamine, ethylamine, propylamine, butylamine, pentylamine, and hexylamine and ions thereof. More preferred are methylamine, ethylamine, and propylamine, and ions thereof. Still more preferred are methylamine and ions thereof.

The organic molecules represented by R may be used alone or in combination of two or more thereof.

In the formula (1), M is a metal atom. Examples thereof include lead, tin, zinc, titanium, antimony, bismuth, nickel, iron, cobalt, silver, copper, gallium, germanium, magnesium, calcium, indium, aluminum, manganese, chromium, molybdenum, and europium. These metal atoms may be used alone or in combination of two or more thereof. From the standpoint of improving the photoconversion efficiency of the solar cell, preferred among them are lead, tin, germanium, indium, antimony, and bismuth, with lead being more preferred.

In the formula (1), X represents a halogen atom. Examples thereof include chlorine, bromine, and iodine. These halogen atoms may be used alone or in combination of two or more thereof. The organic-inorganic perovskite compound containing a halogen atom is soluble in an organic solvent and can be used in an inexpensive printing method or the like. The halogen atom is preferably an iodine atom. The use of iodine allows the organic-inorganic perovskite compound (A) to have a narrower energy band gap, making it easy to improve the photoconversion efficiency.

The organic-inorganic perovskite compound (A) preferably has a cubic crystal structure where the metal atom M is placed at the body center, the organic molecule R is placed at each vertex, and the halogen atom X is placed at each face center. Although the details are not clear, it is presumed that the cubic crystal structure allows the octahedron in the crystal lattice to change its orientation easily, which enhances the mobility of electrons in the organic-inorganic perovskite compound (A), improving the photoelectric conversion efficiency of the solar cell.

The organic-inorganic perovskite compound (A) constituting the perovskite layer is preferably a reaction product of the at least one selected from the group consisting of the metal halide (B1) and the organometal halide (B2) with the organohalide (C). When the organic-inorganic perovskite compound (A) is such a reaction product, the perovskite layer can be formed by attaching at least one of the component (B1) or the component (B2) and the component (C) to the same region and allowing the components to react in the region. In addition, by forming a region to which the at least one of the component (B1) or the component (B2) is attached but the component (C) is not attached, or a region to which the component (C) is attached but the at least one of the component (B1) or the component (B2) is not attached, the side-surface-protecting layer containing the at least one of the component (B1) or the component (B2) or containing the component (C) can be formed in the region.

Metal Halide (B1) and Organometal Halide (B2)

At least one of the metal halide (B1) or the organometal halide (B2) is one of the components that can constitute the side-surface-protecting layer. At least one of the metal halide (B1) or the organometal halide (B2) reacts with the organohalide (C) to produce the organic-inorganic perovskite compound (A). In the present invention, the use of at least one of the metal halide (B1) or the organometal halide (B2) in the side-surface-protecting layer makes it possible to appropriately prevent moisture ingress into the perovskite layer. The metal halide (B1) and the organometal halide (B2) are also raw materials (precursors) of the organic-inorganic perovskite compound (A) as described above. The use of thereof as a raw material of the perovskite layer enables easy formation of the side-surface-protecting layer and the perovskite layer.

From the standpoint of easy formation of the side-surface-protecting layer and the perovskite layer, the metal halide (B1) and the organometal halide (B2) contained in the side-surface-protecting layer are preferably the same compounds as those used as the precursors of the organic-inorganic perovskite compound (A) contained in the perovskite layer.

The metal halide (B1) may be any metal halide that can react with the organohalide (C) to produce the organic-inorganic perovskite compound (A). The metal halide (B1) is preferably a compound represented by the following formula (2):

$$MX_k \tag{2}$$

where M and X are the same as M and X in the formula (1), respectively, and k is an integer of 1 to 3.

In the formula (2), k is preferably 2. The descriptions of M and X in the metal halide (B1) are the same as above, and thus omitted here.

Specific preferred examples of the metal halide (B1) include lead chloride ($PbCl_2$), lead bromide ($PbBr_2$), lead iodide ($PbI_2$), tin chloride ($SnCl_2$), tin bromide ($SnBr_2$), tin iodide ($SnI_2$), indium chloride (InCl), indium bromide (InBr), and indium iodide (InI). More preferred among them are lead chloride, lead bromide, and lead iodide, with lead iodide being more preferred.

In the case where a monovalent metal halide such as a monovalent indium halide is used, the monovalent metal halide may be mixed with a trivalent metal halide.

The organometal halide (B2) is a complex obtained by coordinating a polar organic molecule to a metal halide. For example, the organometal halide (B2) contains the metal halide (B1) and a compound (hereinafter also referred to simply as a compound (B3)) that can form a complex with the metal halide (B1).

Examples of the compound (B3) include sulfoxide compounds and amide compounds. As described later, a solvent mixed with the metal halide (B1) can also be the compound (3) that can form a complex with the metal halide (B1), depending on the type of the metal halide (B1).

Examples of the sulfoxide compound include compounds represented by the formula Y—S(=O)—Y'. In the formula, Y and Y' each represents a C1-C18 hydrocarbon group that may optionally have a substituent. Examples thereof include a methyl group, an ethyl group, a propyl group, a butyl group, a pentyl group, a hexyl group, a heptyl group, an octyl group, a decyl group, a dodecyl group, a methylene group, a phenyl group, a naphthyl group, a biphenyl group, a methoxy group, an ethoxy group, a propoxy group, and a butoxy group. Preferred among them are a methyl group, an ethyl group, a propyl group, a n-butyl group, a t-butyl group, and a phenyl group, with a methyl group being particularly preferred. Y and Y' may be the same as or different from each other.

Preferred among them as the compound (B3) are sulfoxide compounds, with dimethyl sulfoxide (DMSO) being more preferred.

The organometal halide (B2) may be produced by any method. Examples thereof include a method of mixing the metal halide (B1) and the compound (B3).

The metal halides (B1) and the organometal halides (B2) may be used alone or in combination of two or more thereof.

Organohalide (C)

The organohalide (C) is one of the components that can constitute the side-surface-protecting layer. In the present invention, the use of the organohalide (C) in the side-surface-protecting layer makes it difficult for moisture to reach the perovskite layer as the organohalide (C) absorbs moisture entering the perovskite layer. The use of the organohalide (C) thus can prevent deterioration of the perovskite layer. The organohalide (C) is also a raw material (precursor) of the organic-inorganic perovskite compound (A) as described above. The use thereof as a raw material of the perovskite layer enables easy formation of the side-surface-protecting layer and the perovskite layer.

As described above, the organohalide (C) reacts with at least one of the metal halide (B1) or the organometal halide (B2) to produce the organic-inorganic perovskite compound (A). The organohalide (C) is preferably a compound represented by the formula (3):

$$RX \tag{3}$$

where R and X are the same as R and X in the formula (1), respectively.

The descriptions of R and X in the organohalide (C) are the same as above, and thus omitted here.

The organohalide (C) is more preferably an alkyl ammonium halide, particularly preferably a primary alkyl ammonium halide.

Specific examples the organohalide (C) include halides of the above organic molecule represented by R. Preferred among them are methyl ammonium chloride, methyl ammonium bromide, methyl ammonium iodide, ethyl ammonium chloride, ethyl ammonium bromide, ethyl ammonium iodide, propyl ammonium chloride, propyl ammonium bromide, propyl ammonium iodide, butyl ammonium chloride, butyl ammonium bromide, butyl ammonium iodide, pentyl ammonium chloride, pentyl ammonium bromide, pentyl ammonium iodide, hexyl ammonium chloride, hexyl ammonium bromide, and hexyl ammonium iodide. More preferred are methyl ammonium iodide, ethyl ammonium iodide, propyl ammonium iodide, with methyl ammonium iodide being particularly preferred.

The organohalides may be used alone or in combination of two or more thereof.

The perovskite layer may consist only of the organic-inorganic perovskite compound (A), but may contain other component(s) in addition to the organic-inorganic perovskite compound (A) without impairing the effects of the present invention. The amount of the organic-inorganic perovskite compound (A) in the perovskite layer is typically 50% by mass or more, preferably 70 to 100% by mass, more preferably 80 to 100% by mass.

Examples of the components contained in the perovskite layer other than the organic-inorganic perovskite compound (A) include at least one of an organic semiconductor or an inorganic semiconductor. The perovskite layer may also contain unreacted residue (e.g., (B1), (B2) and (C) components) of the raw materials for the formation of the organic-inorganic perovskite compound (A).

Examples of the organic semiconductor include compounds having a thiophene skeleton, such as poly(3-alkyl-thiophene). The examples also include conductive polymers having a poly-p-phenylenevinylene skeleton, a polyvinylcarbazole skeleton, a polyaniline skeleton, a polyacetylene skeleton, or the like. The examples further include: compounds having a phthalocyanine skeleton, a naphthalocyanine skeleton, a pentacene skeleton, and a porphyrin skeleton such as a benzoporphyrin skeleton, a spirobifluorene skeleton, or the like; and carbon-containing materials such as carbon nanotube, graphene, and fullerene, each of which may be surface-modified.

Examples of the inorganic semiconductor include titanium oxide, zinc oxide, indium oxide, tin oxide, gallium oxide, tin sulfide, indium sulfide, zinc sulfide, CuSCN, $Cu_2O$, $MoO_3$, $V_2O_5$, $WO_3$, $MoS_2$, $MoSe_2$, and $Cu_2S$.

When the perovskite layer contains at least one of an organic semiconductor or an inorganic semiconductor, the perovskite layer may be a composite film in which at least one of an organic semiconductor part or an inorganic semiconductor part is combined with an organic-inorganic perovskite compound part.

The at least one of an organic semiconductor or an inorganic semiconductor may be formed as an organic semiconductor layer or an inorganic semiconductor layer, and may form a laminated structure with the perovskite layer to have a function of a photoelectric conversion layer together with the perovskite layer. The organic semiconductor layer or the inorganic semiconductor layer may have a role of an electron transport layer or a hole-transport layer as described later.

When the side-surface-protecting layer contains a compound selected from the group consisting of the metal halide (B1) and the organometal halide (B2), the side-surface-protecting layer may contain component(s) other than the metal halide (B1) and the organometal halide (B2) without impairing the effects of the present invention. The total amount of the metal halide (B1) and the organometal halide (B2) in the side-surface-protecting layer is typically 50% by mass or more, preferably 70 to 100% by mass, more preferably 80 to 100% by mass.

Examples of the components contained in the side-surface-protecting layer other than the metal halide (B1) and the organometal halide (B2) include the organic semiconductors and inorganic semiconductors described above.

When the side-surface-protecting layer contains the organohalide (C), the side-surface-protecting layer may contain component(s) other than the organohalide (C) without impairing the effects of the present invention. Examples of the components contained in the side-surface-protecting layer other than the organohalide (C) include the organic semiconductors and inorganic semiconductors described above.

Layer Structure of Solar Cell

The solar cell of the present invention includes first and second electrodes, a perovskite layer provided between the first and second electrodes, and a side-surface-protecting layer provided on the peripheral side of the perovskite layer. The solar cell may contain layer(s) other than the first and second electrodes, perovskite layer, and side-surface-protecting layer without impairing the effects of the present invention.

For example, an electron transport layer may be provided between the cathode (first or second electrode) and the perovskite layer. A hole transport layer may be provided between the anode (first or second electrode) and the perovskite layer.

The solar cell may include a barrier layer to protect the solar cell from moisture ingress along the thickness direction. The barrier layer may be formed on one or both of the first and second electrodes, on the side opposite to the side on which the perovskite layer is formed. The barrier layer may be bonded to the first or second electrode via an adhesive layer, for example. Furthermore, as described above, layers such as an inorganic semiconductor layer and an organic semiconductor layer may be stacked on the perovskite layer.

The solar cell preferably includes a substrate. A laminate including the first and second electrodes, the perovskite layer, the side-surface-protecting layer, and other optional layer(s) may be formed on the substrate.

FIG. 1 illustrates one embodiment of the solar cell of the present invention. As illustrated in FIG. 1, a solar cell 10 according to one embodiment of the present invention includes a substrate 11. The solar cell further includes, on the substrate 11, a first electrode 12 as a cathode, an electron transport layer 13, a perovskite layer 14 and a side-surface-protecting layer 15, a hole-transport layer 16, a second electrode 17, an adhesive layer 18, and a barrier layer 19, in the stated order.

Structure of Side-Surface-Protecting Layer and Perovskite Layer

Figure 2:
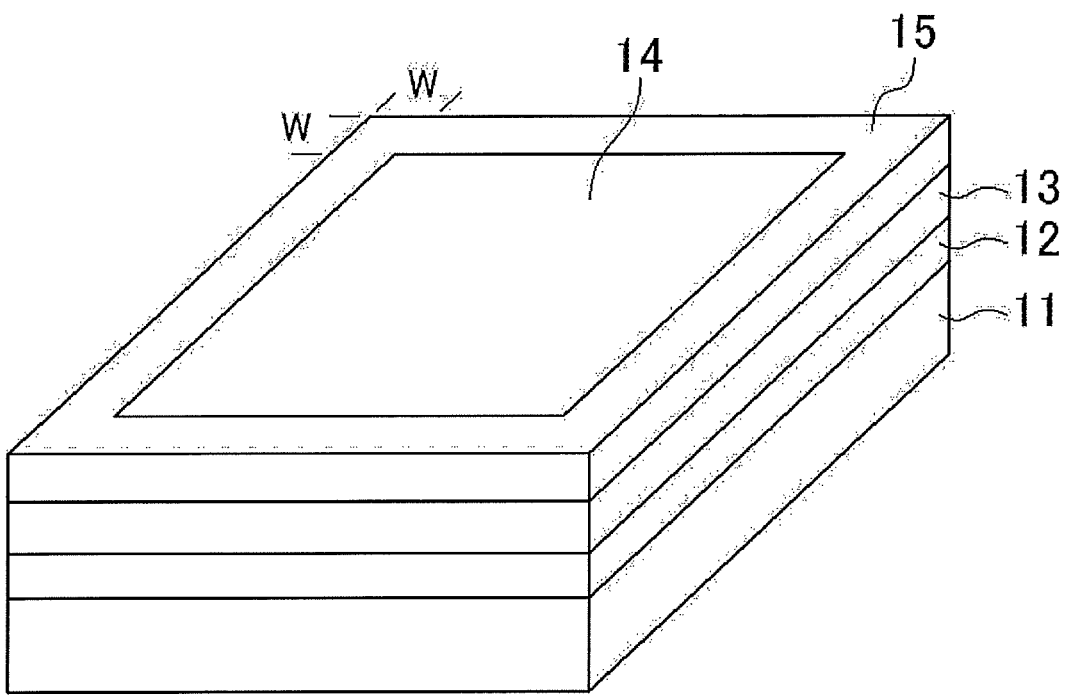
FIG. 2 is a schematic perspective view of one embodiment of the structure of a side-surface-protecting layer and a perovskite layer according to the present invention.

FIG. 2 is a schematic perspective view of one embodiment of the structure of a side-surface-protecting layer and a perovskite layer according to the present invention. The structure of the side-surface-protecting layer and the perovskite layer is described in more detail below with reference to FIG. 2.

As illustrated in FIG. 2, the side-surface-protecting layer 15 is formed on the peripheral side of the perovskite layer 14 to be continuous with the perovskite layer 14. The side-surface-protecting layer coats the side surfaces of the perovskite layer 14. As a result, the side-surface-protecting layer 15 prevents exposure of the side surfaces of the perovskite layer 14, thus preventing moisture ingress and the like from the side surfaces.

In one embodiment of the present invention, as illustrated in FIG. 2, the side-surface-protecting layer 15 formed on the peripheral side of the perovskite layer 14 surrounds the entire periphery of the perovskite layer 14. In this case, all the side surfaces of the perovskite layer 14 are coated with the side-surface-protecting layer 15, so that moisture ingress from the side surfaces can be effectively prevented.

As described above, the side-surface-protecting layer 15 may contain a compound selected from the group consisting of the metal halide (B1) and the organometal halide (B2) or may contain the organohalide (C). When the side-surface-protecting layer 15 contains a compound selected from the group consisting of the metal halide (B1) and the organometal halide (B2), the side-surface-protecting layer 15 can more effectively prevent moisture ingress from the side surfaces. When the side-surface-protecting layer 15 contains the organohalide (C), the formed side-surface-protecting layer is white, thus offering the advantage of high design quality. When the side-surface-protecting layer contains the metal halide (B1) and the organometal halide (B2), such a side-surface-protecting layer is not preferred from a visual and aesthetic point of view; for example, such a side-surface protecting layer containing a lead atom is yellow.

It is not necessary that all the side surfaces of the perovskite layer 14 are coated with the side-surface-protecting layer 15. Only part of the side surfaces may be coated with the side-surface-protecting layer 15. Specifically, it is sufficient that 20% or more of all the side surfaces of the perovskite layer 14 are coated. Preferably, 45% or more, more preferably 70% or more of all the side surfaces are coated. Most preferably, 100% of all the side surfaces, that is, all the side surfaces, are coated.

When the perovskite layer 14 has a quadrangular shape in a plan view, for example, as shown in FIG. 2, all the four sides are most preferably coated with the side-surface-protecting layer 15, but only one, two, or three sides may be coated with the side-surface-protecting layer 15.

The shape of the perovskite layer 14 in a plan view is not limited to a quadrangular shape. The perovskite layer 14 may have a polygonal shape other than a quadrangular shape, such as a triangular, heptagonal, or hexagonal shape, or a shape having a curve such as a circular or elliptic shape.

The side-surface-protecting layer 15 preferably has a width W of 0.5 mm or more outside the periphery of the perovskite layer 14. The width W means the minimum distance from the periphery of the perovskite layer 14 to the periphery of the side-surface-protecting layer 15. When the width W is 0.5 mm or more, the side-surface-protecting layer 15 can appropriately protect the perovskite layer 14. The width W is more preferably 0.9 mm or more, still more preferably 1.8 mm or more. Furthermore, although the width W is not particularly limited, the width W is preferably 20 mm or less, more preferably 10 mm or less, still more preferably 5 mm or less from the standpoint of avoiding a reduction in the effective photoelectric conversion area.

The side-surface-protecting layer 15 is preferably formed on the same surface as the perovskite layer 14. The "formed on the same surface" herein means that the perovskite layer 14 and the side-surface-protecting layer 15 are formed on the same surface of the same layer. For example, when the perovskite layer 14 is formed on the electron transport layer 13 as illustrated in FIG. 1, the "formed on the same surface" means that the side-surface-protecting layer 15 is also formed on the electron transport layer 13. When the electron transport layer 13 is omitted and the perovskite layer is formed directly on the first electrode 12, the "formed on the same surface" means that the side-surface-protecting layer 15 is also formed directly on the first electrode 12.

When the side-surface-protecting layer 15 is formed on the same surface as the perovskite layer 14 as described above, the side-surface-protecting layer 15 can easily protect the side surfaces of the perovskite layer 14. In addition, the side-surface-protecting layer 15 can be easily formed by a production method such as the production method described later in which the side-surface-protecting layer 15 is formed at the same time as the perovskite layer 14 in the step of forming the perovskite layer 14.

Here, as long as the side-surface-protecting layer 15 coats a side surface of the perovskite layer 14, the side-surface-protecting layer 15 and the perovskite layer 14 are not necessarily formed on the same surface. For example, the side-surface-protecting layer 15 may be formed on the surface of the first electrode 12 or the substrate 11 while the perovskite layer 14 is formed on the surface of the electron transport layer 13.

The side-surface-protecting layer and the perovskite layer each preferably have a thickness of 5 to 5,000 nm. When the thickness is 5 nm or more, the perovskite layer can sufficiently absorb light, enhancing the photoelectric conversion efficiency. When the thickness is 5,000 nm or less, formation of a region which fails to achieve charge separation can be reduced, improving the photoelectric conversion efficiency. The thickness of the perovskite layer and the thickness of the side-surface-protecting layer are each more preferably 10 to 1,000 nm, still more preferably 20 to 500 nm.

The side-surface-protecting layer and the perovskite layer may have the same thickness or different thicknesses. For the side-surface-protecting layer to protect a side surface of the perovskite layer, the side-surface-protecting layer and the perovskite layer preferably have the same thickness, or have as small a difference as possible in thickness if they have different thicknesses.

First and Second Electrodes

Either one of the first and second electrodes used in the solar cell of the present invention serves as a cathode while the other serves as an anode. Examples of the material constituting the cathode include fluorine-doped tin oxide (FTO), sodium, sodium-potassium alloys, lithium, magnesium, aluminum, magnesium-silver mixtures, magnesium-indium mixtures, aluminum-lithium alloys, Al/Al$_2$O$_3$ mixtures, and Al/LiF mixtures. These materials may be used alone or in combination of two or more thereof.

The cathode may have any thickness. For example, the thickness is 1 nm to 10 μm, preferably 10 to 5,000 nm.

Examples of the material constituting the anode include metals such as gold and silver, transparent conductive materials such as CuI, indium tin oxide (ITO), SnO$_2$, aluminum zinc oxide (AZO), indium zinc oxide (IZO), and gallium zinc oxide (GZO), and transparent conductive polymers. These materials may be used alone or in combination of two or more thereof.

The anode may have any thickness. For example, the thickness is 1 nm to 10 μm, preferably 10 to 2,000 nm.

The first and second electrodes each may be in the form of a layer. The first and second electrodes each may be appropriately patterned.

Electron Transport Layer

As described above, the solar cell of the present invention may have an electron transport layer between the cathode and the photoelectric conversion layer (perovskite layer). The electron transport layer may be formed from any material. Examples of the material include N-type conductive polymers, N-type low-molecular organic semiconductors, N-type metal oxides, N-type metal sulfides, alkali metal halides, alkali metals, and surfactants. Specific examples thereof include cyano group-containing polyphenylene vinylene, boron-containing polymers, bathocuproine, bathophenanthroline, (hydroxyquinolinato)aluminum, oxadiazole compounds, benzoimidazole compounds, naphthalenetetracarboxylic acid compounds, perylene derivatives, phosphine oxide compounds, phosphine sulfide compounds, fluoro group-containing phthalocyanine, titanium oxide, zinc oxide, indium oxide, tin oxide, gallium oxide, tin sulfide, indium sulfide, and zinc sulfide.

The electron transport layer may consist only of a non-porous, thin-film electron transport layer. Preferably, the electron transport layer includes a porous electron transport layer. More preferably, a porous electron layer is formed on a non-porous, thin-film electron layer, and the perovskite layer is preferably formed on the porous electron transport layer. The electron transport layer may appropriately contain additive(s).

The electron transport layer preferably has a thickness of 1 to 2,000 nm. When the thickness is 1 nm or greater, holes can be blocked. When the thickness is 2,000 nm or smaller, the layer has low resistance to electron transport, enhancing the photoelectric conversion efficiency. The thickness of the electron transport layer is more preferably 3 to 1,000 nm, still more preferably 5 to 800 nm.

Hole Transport Layer

The solar cell of the present invention may have a hole transport layer between the anode and the photoelectric conversion layer (perovskite layer). The hole transport layer may be formed from any material. Examples of the material include P-type conductive polymers, P-type low-molecular organic semiconductors, P-type metal oxides, P-type metal sulfides, and surfactants. Specific examples thereof include compounds having a thiophene skeleton, such as polystyrenesulfonic acid adducts of polyethylenedioxythiophene and carboxy group-containing polythiophenes. The examples further include compounds having a phthalocyanine skeleton, such as phthalocyanine, compounds having a porphyrin skeleton, such as porphyrin, and compounds having a spirobifluorene skeleton, such as 2,2',7,7'-tetrakis(N,N-di-p-methoxyphenylamine)-9,9'-spirobifluorene (Spiro-OMeTAD). The examples furthermore include molybdenum oxide, vanadium oxide, tungsten oxide, nickel oxide, copper oxide, tin oxide, molybdenum sulfide, tungsten sulfide, copper sulfide, tin sulfide, CuSCN, CuI, fluoro group-containing phosphonic acid, and carbonyl group-containing phosphonic acid. Examples furthermore include carbon-containing materials such as carbon nanotube and graphene, each of which may be surface-modified. The hole transport layer may appropriately contain additive(s).

The hole transport layer preferably has a thickness of 1 to 2,000 nm. When the thickness is 1 nm or more, electrons can be blocked. When the thickness is 2,000 nm or less, the layer has low resistance to hole transport, enhancing the photoelectric conversion efficiency. The thickness is more preferably 3 to 1,000 nm, still more preferably 5 to 800 nm.

Barrier Layer

The solar cell may have a barrier layer on one or both of the first and second electrodes, on the side opposite to the side on which the perovskite layer is formed. In the case where the barrier layer is formed, the solar cell preferably includes, on the substrate, the first electrode, the perovskite layer and the side-surface-protecting layer, the second electrode, and the barrier layer in the stated order.

The barrier layer is a layer to prevent moisture ingress along the thickness direction of the solar cell. The barrier layer also protects the solar cell from foreign matter and the like. The barrier layer may be, for example, a layer of any of various metals such as aluminum, gold, silver, copper, iron, titanium, or nickel. The barrier layer may be a layer of glass, a ceramic substrate, or a plastic substrate. The barrier layer may be an inorganic layer such as a layer of a metal oxide, a metal nitride, or a metal oxynitride. The barrier layer may be a resin layer formed from any of various resins such as polyethylene terephthalate, polyethylene naphthalate, polycycloolefin, polyisobutylene, or acrylic resin or a laminate of such layers.

The barrier layer may have any thickness. The thickness is preferably 10 nm to 200 μm, more preferably 50 nm to 100 μm.

An adhesive layer may be formed to bond the barrier layer to the first or second electrode via the adhesive layer. Examples of the adhesive layer include layers of various adhesives such as rubber adhesives, acrylic adhesives, and silicone adhesives. The adhesive used in the adhesive layer preferably has high barrier properties.

Substrate

The solar cell of the present invention may contain any substrate. Transparent substrates are suitable. Examples thereof include transparent glass substrates made of soda-lime glass, alkali-free glass, or the like, ceramic substrates, and transparent plastic substrates.

Method for Producing Solar Cell

The method for producing a solar cell of the present invention is described below.

The method for producing a solar cell of the present invention includes, for example, the following steps (a) to (c):

step (a) of forming a first electrode;
step (b) of forming a perovskite layer and a side-surface-protecting layer on the first electrode; and
step (c) of forming a second electrode on the perovskite layer.

Step (a)

In step (a), the first electrode may be produced by any method. For example, the first electrode may be formed on a substrate by a conventional method. On the first electrode may be appropriately formed an electron transport layer, an organic semiconductor layer, an inorganic semiconductor layer, and the like before the formation of a perovskite layer.

Step (b)

In the production method, step (b) is performed after step (a). In step (b), at least a perovskite layer is formed by step (b1) of attaching at least one selected from the group consisting of a metal halide (B1) and an organometal halide (B2) and step (b2) of attaching an organohalide (C). The perovskite layer is a layer containing an organic-inorganic perovskite compound (A) as described above. Step (b1) and step (b2) may be performed in either order.

In step (b1), the at least one selected from the group consisting of the (B1) and (B2) components may be attached by any method, and may be attached by applying a first coating solution containing at least one of the (B1) component or the (B2) component. Preferably, the first coating solution further contains a solvent, and the (B1) and (B2) components in the first coating solution are dissolved in the solvent. The solvent used in the first coating solution may be any solvent in which the (B1) and (B2) components can be dissolved. Examples of solvents that can be used include N,N-dimethylformamide (DMF), γ-butyrolactone, 2-methoxyethanol, and dimethyl sulfoxide (DMSO). The solvents may be used alone or in combination of two or more thereof. In the case of mixing two or more solvents, for example, a solvent that has low solvency power for the (B1) and (B2) components when used alone may be used as long as the solids concentration can be adjusted within a range that can provide a required film thickness. The first coating solution may contain component(s) other than the (B1) and (B2) components and the solvent, if necessary. For example, the first coating solution may contain any of the organic semiconductors and inorganic semiconductors described above.

The applied first coating solution may be dried by appropriate heating or the like.

In step (b2), the organohalide (C) may be attached by any method, and may be attached by applying a second coating solution containing the (C) component. Preferably, the second coating solution further contains a solvent, and the (C) component is dissolved in the solvent. The solvent used for preparing the second coating solution may be any solvent in which the (C) component can be dissolved. Examples thereof include protic solvents such as isopropyl alcohol (IPA) and ethanol. The solvents may be used alone or in combination of two or more thereof. In the case of mixing two or more solvents, for example, a solvent that has low solvency power for the (C) component when used alone may be used as long as the solids concentration can be adjusted within a range that can provide a required film thickness.

The second coating solution may contain component(s) other than the (C) component and the solvent, if necessary. For example, the second coating solution may contain any of the organic semiconductors and inorganic semiconductors described above.

The applied second coating solution may be dried by appropriate heating or the like.

The first and second coating solutions may be applied by any method. Examples thereof include a die-coating method, a spin coating method, and a casting method. A printing method such as a roll-to-roll method may be used.

The (B1) and (B2) components and the (C) component may be directly attached to the first electrode. When a layer other than an electrode, such as the electron transport layer, is formed on the first electrode, the components may be attached to the layer.

When the at least one of the (B1) component or the (B2) component is used in the side-surface-protecting layer, in step (b1), the at least one of the (B1) component or the (B2) component may be attached to a region in which the perovskite layer and the side-surface-protecting layer are formed in the solar cell. In step (b2), the (C) component may be attached to a region in which the perovskite layer is formed. When the (C) component is used in the side-surface-protecting layer, in step (b2), the (C) component may be attached to a region in which the perovskite layer and the side-surface-protecting layer are formed in the solar cell. In step (b1), the at least one of the (B1) component or the (B2) component may be attached to a region in which the perovskite layer is formed.

Accordingly, when the at least one of the (B1) component or the (B2) component is used in the side-surface-protecting layer, the region to which the at least one of the (B1) component or the (B2) component is attached overlaps the region to which the (C) component is attached, and protrudes outward from at least part of the periphery of the region to which the (C) component is attached. When the (C) component is used in the side-surface-protecting layer, the region to which the (C) component is attached overlaps the region to which the at least one of the (B1) component or the (B2) component is attached, and protrudes outward from at least part of the periphery of the region to which the (B1) component or the (B2) component is attached. Thus, when the at least one of the (B1) component or the (B2) component is used in the side-surface-protecting layer, the at least one of the (B1) component or the (B2) component and the (C) component react in the region to which both of them are attached, thus producing the organic-inorganic perovskite compound (A) to form the perovskite layer. In the region to which the (C) component is not attached but the at least one of the (B1) component or the (B2) component is attached, the at least one of the (B1) component or the (B2) component remains as it is and forms the side-surface-protecting layer. When the (C) component is used in the side-surface-protecting layer, the at least one of the (B1) component or the (B2) component and the (C) component react in the region to which both of them are attached, thus producing the organic-inorganic perovskite compound (A) to form the perovskite layer. In the region to which the at least one of the (B1) component or the (B2) component is not attached but the (C) component is attached, the (C) component remains as it is and forms the side-surface-protecting layer.

When the at least one of the (B1) component or the (B2) component is used in the side-surface-protecting layer, the region to which the at least one of the (B1) component or the (B2) component is attached protrudes outward from at least part of the periphery of the region to which the (C) component is attached, preferably from the entire periphery of the region to which the (C) component is attached. When the (C) component is used in the side-surface-protecting layer, the region to which the (C) component is attached protrudes outward from at least part of the periphery of the region to which the at least one of the (B1) component or the (B2) component is attached, preferably from the entire periphery of the region to which the at least one of the (B1) component or the (B2) component is attached. As a result, the side-surface-protecting layer surrounds the perovskite layer as illustrated in FIG. 2.

The width W described above corresponds to the length (protruding length) by which the region to which the at least one of the (B1) component or the (B2) component or the (C) component is attached protrudes outward from the periphery of the region to which the other component is attached. The protruding length is thus preferably 0.5 mm or more, more preferably 0.9 mm or more, still more preferably 1.8 mm or more. The protruding length is preferably 20 mm or less, more preferably 10 mm or less, still more preferably 5 mm or less.

The at least one of the (B1) component or the (B2) component and the (C) component may be attached in any order. Preferably, the (C) component is attached after the at least one of the (B1) component or the (B2) component is attached. According to this method, a layer containing the (B1) and (B2) components is formed first, and then the (C) component is attached to the layer. Compared to the organohalide (C), the metal halide (B1) and the organometal halide (B2) are easily formed into a film even when used alone. Thus, attaching the (B1) and (B2) components first leads to good film formability in formation of the perovskite layer.

In the production method, the perovskite layer is formed such that the layer formed from the component attached first (e.g., the at least one of the (B1) component or the (B2) component) is impregnated with the component attached later (e.g., the (C) component). This allows the side-surface-protecting layer and the perovskite layer to have substantially the same thickness, so that the side surfaces of the perovskite layer are presumably appropriately protected by the side-surface-protecting layer.

Step (c)

In the production method, step (c) is performed after step (b). In step (c), the second electrode is formed on the perovskite layer. The second electrode may be formed by any method, such as a sputtering method or an evaporation method.

Before formation of the second electrode, a hole transport layer, an organic semiconductor layer, an inorganic semiconductor layer, and the like may be appropriately formed on the perovskite layer. A barrier layer may be further formed on the second electrode. The barrier layer may be bonded to the second electrode via an adhesive layer, for example.

EXAMPLES

The present invention is described in more detail below with reference to examples. The present invention should not be limited to these examples.

Example 1

A FTO film having a thickness of 1,000 nm as a first electrode to serve as a cathode was formed on a glass substrate. Ultrasonic cleaning was performed with pure water, acetone, and methanol in the stated order, each for 10 minutes, followed by drying. A titanium isopropoxide solution in ethanol adjusted to a concentration of 2% was applied to a surface of the FTO film by a spin coating method, then fired at 400° C. for 10 minutes to form a thin-film electron transport layer having a thickness of 20 nm. To the thin-film electron transport layer was applied, by a spin coating method, a titanium oxide paste containing polyisobutyl methacrylate as an organic binder and titanium oxide (mixture of particles having an average particle size of 10 nm and particles having an average particle size of 30 nm). The titanium oxide paste was then fired at 500° C. for 10 minutes to form a porous electron transport layer having a thickness of 500 nm.

Subsequently, lead iodide ($PbI_2$) and N,N-dimethylformamide (DMF) were mixed at a mole ratio of 1:10 to prepare a solution (first coating solution). The first coating solution was applied to the porous electron transport layer with a tabletop die coater (product name "NewTaku Die S" available from Die-Gate Co., Ltd.). The DMF as a solvent was dried to attach the lead iodide to the electron transport layer, thus forming a lead iodide layer. The lead iodide layer was formed in a quadrangular region (50×50 mm). Subsequently, methyl ammonium iodide (MAI) and isopropyl alcohol (IPA) were mixed at a mole ratio of 1:30 to prepare a solution (second coating solution). The second coating solution was applied to the lead iodide layer with the tabletop die coater and dried to attach the MAI. The second coating solution was applied in a quadrangular shape, and the four sides thereof were each in a region 0.5 mm inward from the periphery of the lead iodide layer.

In the region to which the lead iodide and the MAI were both attached, the lead iodide and methyl ammonium iodide reacted to produce an organic-inorganic perovskite compound represented by the formula ($CH_3NH_3PbI_3$), thus forming a perovskite layer. In the region to which the MAI was not attached but the lead iodide was attached, a side-surface-protecting layer including a lead iodide layer was formed. Thus, as illustrated in FIG. 2, the side surfaces of the perovskite layer on all the four sides were coated with the side-surface-protecting layer and surrounded by the side-surface-protecting layer. The perovskite layer and the side-surface-protecting layer each had a thickness of 400 nm.

Thereafter, 68 mM of Spiro-OMeTAD as a compound having a spirobifluorene skeleton, 55 mM of tert-butylpyridine, and 9 mM of lithium bis(trifluoromethylsulfonyl)imide salt were dissolved in 25 μL of chlorobenzene to prepare a solution. The solution was formed into a film having a thickness of 300 nm by a spin coating method to form a hole transport layer. On the hole-transport layer was formed, by vacuum evaporation, a gold film having a thickness of 100 nm as a second electrode to serve as an anode.

Subsequently, to an aluminum foil having a thickness of 50 μm as a barrier layer was applied a 10% by mass solution of an adhesive (product name "OPPANOL B50", available from BASF) in cyclohexane by a doctor blade method to a thickness of 10 μm. The solvent was then dried to form a laminate including an adhesive layer and the barrier layer. The laminate was bonded to the second electrode via the adhesive layer using a laminator to provide a solar cell in which, as illustrated in FIG. 1, the first electrode, the electron transport layer, the perovskite layer and the side-surface-protecting layer, the hole-transport layer, the second electrode, the adhesive layer, and the barrier layer were stacked in the stated order on the substrate.

Example 2

A solar cell was obtained as in Example 1 except that the second coating solution was applied to a region 1.0 mm inward from the periphery of the lead iodide layer.

Example 3

A solar cell was obtained as in Example 1 except that the second coating solution was applied to a region 2.0 mm inward from the periphery of the lead iodide layer.

Example 4

A solar cell was obtained as in Example 2 except that glass was used as a barrier layer instead of the aluminum foil.

Example 5

A solar cell was obtained as in Example 2 except that OPPANOL B80 (product name, available from BASF) was used as an adhesive instead of OPPANOL B50.

Example 6

A solar cell was obtained as in Example 2 except that OPPANOL B100 (product name, available from BASF) was used as an adhesive instead of OPPANOL B50.

Example 7

A solar cell was obtained as in Example 2 except that a lead iodide/DMSO complex layer was formed instead of the lead iodide layer. The lead iodide/DMSO complex layer was formed by mixing lead iodide ($PbI_2$), dimethyl sulfoxide (DMSO), and N,N-dimethylformamide (DMF) at a mole ratio of 1:1:10 to prepare a solution (first coating solution), applying the first coating solution to the electron transport layer, and then drying the DMF as a solvent.

Example 8

A solar cell was obtained as in Example 1 except that the second coating solution was applied in a quadrangular shape such that three sides were each in a region 1.0 mm inward from the periphery of the quadrangular lead iodide layer and the other side protruded outward from the periphery by 1.0 mm.

Example 9

A solar cell was obtained as in Example 1 except that the second coating solution was applied in a quadrangular shape such that two sides were each in a region 1.0 mm inward from the periphery of the quadrangular lead iodide layer and the other two sides protruded outward from the periphery by 1.0 mm.

Example 10

A solar cell was obtained as in Example 8 except that OPPANOL B80 (product name, available from BASF) was used as an adhesive instead of OPPANOL B50.

Example 11

A solar cell was obtained as in Example 8 except that glass was used as a barrier layer instead of the aluminum foil.

Example 12

A solar cell was obtained as in Example 1 except that the second coating solution was applied in a quadrangular shape such that all the four sides protruded outward from the periphery of the lead iodide layer by 0.7 mm.

Example 13

A solar cell was obtained as in Example 1 except that the second coating solution was applied in a quadrangular shape such that one side was in a region 0.7 mm inward from the periphery of the quadrangular lead iodide layer and the other three sides protruded outward from the periphery by 1.5 mm.

Example 14

A solar cell was obtained as in Example 1 except that the second coating solution was applied such that three sides were each in a region 1.5 mm inward from the periphery of the quadrangular lead iodide layer and the other side coincided with the region in which the lead iodide layer was formed.

Example 15

A solar cell was obtained as in Example 1 except that the second coating solution was applied such that two sides were each in a region 2.0 mm inward from the periphery of the quadrangular lead iodide layer and the other two sides coincided with the region in which the lead iodide layer was formed.

Comparative Example 1

A solar cell was obtained as in Example 1 except that the region to which the solution (second coating solution) obtained by mixing methyl ammonium iodide (MAI) and isopropyl alcohol (IPA) at a mole ratio of 1:30 was applied coincided with the region to which the lead iodide layer was formed.

Evaluation

The solar cells obtained in the examples and comparative examples were evaluated as follows.

Durability Evaluation

A durability test was performed by putting the solar cell under the conditions of a relative humidity of 85% and a temperature of 85° C. for 200 hours. A power source (model 236 available from Keithley Instruments Inc.) was connected between the electrodes of the solar cell before and after the durability test. The photoelectric conversion efficiency was measured using a solar simulator (available from Yamashita Denso Corp.) at an intensity of 100 mW/cm$^2$. The ratio of the photoelectric conversion efficiency after the durability test to the photoelectric conversion efficiency before the durability test was calculated in percentage. A ratio of 80% or higher was evaluated as "A". A ratio of 30% or higher but lower than 80% was evaluated as "B". A ratio of lower than 30% was evaluated as "C". Table 1 shows the results of the durability test.

TABLE 1

| | Barrier layer | Adhesive layer | Material of first coating solution | Number of coated sides of periphery | Peripheral width (mm) | | | | Durability | |
|---|---|---|---|---|---|---|---|---|---|---|
| | | | | | Side 1 | Side 2 | Side 3 | Side 4 | % | Evaluation |
| Example 1 | Aluminum foil | OPPANOL B50 | PbI$_2$ | 4 sides | +0.5 | +0.5 | +0.5 | +0.5 | 88 | A |
| Example 2 | Aluminum foil | OPPANOL B50 | PbI$_2$ | 4 sides | +1.0 | +1.0 | +1.0 | +1.0 | 95 | A |
| Example 3 | Aluminum foil | OPPANOL B50 | PbI$_2$ | 4 sides | +2.0 | +2.0 | +2.0 | +2.0 | 96 | A |
| Example 4 | Glass | OPPANOL B50 | PbI$_2$ | 4 sides | +1.0 | +1.0 | +1.0 | +1.0 | 94 | A |
| Example 5 | Aluminum foil | OPPANOL B80 | PbI$_2$ | 4 sides | +1.0 | +1.0 | +1.0 | +1.0 | 86 | A |
| Example 6 | Aluminum foil | OPPANOL B100 | PbI$_2$ | 4 sides | +1.0 | +1.0 | +1.0 | +1.0 | 91 | A |
| Example 7 | Aluminum foil | OPPANOL B50 | PbI$_2$·DMSO | 4 sides | +1.0 | +1.0 | +1.0 | +1.0 | 83 | A |
| Example 8 | Aluminum foil | OPPANOL B50 | PbI$_2$ | 4 sides | +1.0 | −1.0 | +1.0 | +1.0 | 44 | B |
| Example 9 | Aluminum foil | OPPANOL B50 | PbI$_2$ | 4 sides | −1.0 | −1.0 | +1.0 | +1.0 | 33 | B |
| Example 10 | Aluminum foil | OPPANOL B80 | PbI$_2$ | 4 sides | +1.0 | −1.0 | +1.0 | +1.0 | 49 | B |
| Example 11 | Glass | OPPANOL B50 | PbI$_2$ | 4 sides | +1.0 | −1.0 | +1.0 | +1.0 | 46 | B |
| Example 12 | Aluminum foil | OPPANOL B50 | PbI$_2$ | 4 sides | −0.7 | −0.7 | −0.7 | −0.7 | 30 | B |
| Example 13 | Aluminum foil | OPPANOL B50 | PbI$_2$ | 4 sides | −1.5 | −1.5 | −1.5 | +0.7 | 64 | B |
| Example 14 | Aluminum foil | OPPANOL B50 | PbI$_2$ | 3 sides | +1.5 | +1.5 | +1.5 | 0.0 | 32 | B |
| Example 15 | Aluminum foil | OPPANOL B50 | PbI$_2$ | 2 sides | +2.0 | +2.0 | 0.0 | 0.0 | 31 | B |
| Comparative Example 1 | Aluminum foil | OPPANOL B50 | PbI$_2$ | 0 sides | 0.0 | 0.0 | 0.0 | 0.0 | 0 | C |

In Table 1, the number of coated sides of the periphery refers to the number of sides coated with the side-surface-protecting layer among the four sides of the periphery of the perovskite layer. The peripheral width refers to, for each side, the minimum distance between the periphery of the region to which the first coating solution was applied and the periphery of the region to which the second coating solution was applied. The peripheral width is given in a positive (+) value when the periphery of the region to which the first coating solution was applied is located outside the periphery of the region to which the second coating solution was applied. The peripheral width is given in a negative (−) value when the periphery of the region to which the first coating solution was applied is located inside the periphery of the region to which the second coating solution was applied. A positive (+) peripheral width value indicates that the components of the first coating solution constitute the side-surface-protecting layer, while a negative (−) peripheral width value indicates that the components of the second coating solution constitute the side-surface-protecting layer.

Examples 1 to 15 show that forming the side-surface-protecting layer on the peripheral side of the perovskite layer prevented moisture ingress from the side surfaces into the perovskite layer, and improved the durability of the solar cell compared to Comparative Example 1 in which no side-surface-protecting layer was formed. Examples 1 to 13 show that better durability was achieved by connecting the side-surface-protecting layer to the four sides of the periphery of the perovskite layer to allow the side-surface-protecting layer to surround the perovskite layer.

REFERENCE SIGNS LIST 10 solar cell
11 substrate
12 first electrode
13 electron transport layer
14 perovskite layer
15 side-surface-protecting layer
16 hole transport layer
17 second electrode
18 adhesive layer
19 barrier layer

The invention claimed is:

1. A solar cell comprising:
   first and second electrodes;
   a perovskite layer provided between the first and second electrodes and containing an organic-inorganic perovskite compound (A) represented by the formula $RMX_3$ where R is an organic group, M is a metal atom, and X is a halogen atom, and wherein the organic-inorganic perovskite compound (A) is produced by reacting at least one member selected from the group consisting of a metal halide (B1) and an organometal halide (B2), with an organohalide (C); and
   a side-surface-protecting layer surrounding an entire periphery of the perovskite layer, the side-surface-protecting layer containing the at least one member selected from the group consisting of the metal halide (B1) and the organometal halide (B2) or containing the organohalide (C),
   wherein the side-surface-protecting layer has a width of 0.5 mm or more outside the periphery of the perovskite layer, and
   the organohalide (C) is an alkyl ammonium halide.

2. A method for producing a solar cell, comprising the steps of:
   (a) forming a first electrode;
   (b) forming at least a perovskite layer on the first electrode by:
      (b1) applying thereon at least one member selected from the group consisting of a metal halide (B1) and an organometal halide (B2), and
      (b2) applying thereon an organohalide (C), which is an alkyl ammonium halide,
      wherein steps (b1) and (b2) may be performed in any order; and
   (c) forming a second electrode on the perovskite layer,
   wherein the at least one member selected from the group consisting of the metal halide (B1) and the organometal halide (B2) is applied to overlap a region to which the organohalide (C) is applied, and further protrudes outward from an entire periphery of the region to which the organohalide (C) is applied and forms a side-surface-protecting layer surrounding an entire periphery of the perovskite layer, or
   the organohalide (C) is applied to overlap a region to which the at least one member selected from the group consisting of the metal halide (B1) and the organometal halide (B2) is applied, and further protrudes outward from an entire periphery of the region to which the at least one member selected from the group consisting of the metal halide (B1) and the organometal halide (B2) is applied and forms the side-surface-protecting layer surrounding the entire periphery of the perovskite layer, and
   wherein the side-surface-protecting layer has a width of 0.5 mm or more outside the periphery of the perovskite layer.

3. The method for producing a solar cell according to claim 2,
   wherein the organohalide (C) is applied after the at least one member selected from the group consisting of the metal halide (B1) and the organometal halide (B2) is applied.

* * * * *